(12) United States Patent
Chai

(10) Patent No.: US 11,636,906 B2
(45) Date of Patent: Apr. 25, 2023

(54) MEMORY DEVICE AND METHOD OF APPLYING OPERATING VOLTAGE

(71) Applicant: SK hynix Inc., Gyeonggi-do (KR)

(72) Inventor: Soo Yeol Chai, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 50 days.

(21) Appl. No.: 17/369,393

(22) Filed: Jul. 7, 2021

(65) Prior Publication Data

US 2022/0230693 A1 Jul. 21, 2022

(30) Foreign Application Priority Data

Jan. 18, 2021 (KR) ........................ 10-2021-0006942

(51) Int. Cl.
| | | |
|---|---|---|
| G11C 16/04 | (2006.01) | |
| G11C 16/34 | (2006.01) | |
| G11C 16/10 | (2006.01) | |
| G11C 16/30 | (2006.01) | |
| G11C 16/08 | (2006.01) | |
| G11C 16/26 | (2006.01) | |

(52) U.S. Cl.
CPC .......... *G11C 16/3459* (2013.01); *G11C 16/08* (2013.01); *G11C 16/102* (2013.01); *G11C 16/26* (2013.01); *G11C 16/30* (2013.01)

(58) Field of Classification Search
CPC ... G11C 16/3459; G11C 16/08; G11C 16/102; G11C 16/26; G11C 16/30; G11C 16/3427; G11C 16/10; G11C 16/32; G11C 16/0483

USPC ...................................................... 365/185.22
See application file for complete search history.

(56) References Cited

U.S. PATENT DOCUMENTS

| | | | | |
|---|---|---|---|---|
| 6,310,374 B1 * | 10/2001 | Satoh | ............... | H01L 27/11521 257/315 |
| 7,379,335 B2 * | 5/2008 | Futatsuyama | ...... | G11C 16/0483 365/185.17 |
| 8,203,882 B2 * | 6/2012 | Hishida | .................. | G11C 16/16 365/185.17 |
| 9,564,232 B1 * | 2/2017 | Lee | ........................ | G11C 16/10 |
| 2005/0213385 A1 * | 9/2005 | Hosono | .................. | G11C 16/08 365/185.17 |

FOREIGN PATENT DOCUMENTS

KR   10-2018-0077970 A   7/2018

* cited by examiner

*Primary Examiner* — Tha-O H Bui
(74) *Attorney, Agent, or Firm* — IP & T Group LLP

(57) ABSTRACT

Provided herein is a memory device and a method of operating the same. The memory device may include a memory block including a plurality of memory cells, and a peripheral circuit configured to apply a plurality of operating voltages to a plurality of word lines of the memory block during a program operation, wherein, during a verify operation included in the program operation, the peripheral circuit may be configured to allow a selected word line, among the plurality of word lines, to float, and may decrease a potential of the selected word line to a pre-level by decreasing potentials of adjacent word lines to the selected word line.

21 Claims, 14 Drawing Sheets

MEMORY DEVICE AND METHOD OF APPLYING OPERATING VOLTAGE

CROSS-REFERENCE TO RELATED APPLICATION

The present application claims priority under 35 U.S.C. § 119(a) to Korean patent application number 10-2021-0006942 filed on Jan. 18, 2021 with the Korean Intellectual Property Office, and which is incorporated herein by reference in its entirety.

BACKGROUND

Field of Invention

Various embodiments of the present disclosure relate to an electronic device, and more particularly to a memory device and a method of operating the memory device.

Description of Related Art

Recently, the paradigm for a computer environment has been converted into ubiquitous computing so that computer systems can be used anytime and anywhere. Due to this, the use of portable electronic devices such as mobile phones, digital cameras, and notebook computers has rapidly increased. In general, such portable electronic devices use a memory system which employs a memory device, in other words, use a data storage device. The data storage device is used as a main memory device or an auxiliary memory device for portable electronic devices.

A data storage device using a memory device provides advantages in that, since there is no mechanical driver, a) stability and durability are excellent, b) an information access speed is very high, and c) power consumption is low. Data storage devices, as an example of the memory system having such advantages, include a universal serial bus (USB) memory device, memory cards having various interfaces, and a solid state drive (SSD).

Memory devices can be classified into a volatile memory device and a nonvolatile memory device.

Such a nonvolatile memory device has comparatively low write and read speed, but retains data stored therein even when the supply of power is interrupted. Therefore, the nonvolatile memory device is used to store data to be retained regardless of whether power is supplied. Representative examples of the nonvolatile memory device include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. The flash memory is classified into a NOR type and a NAND type.

SUMMARY

Various embodiments of the present disclosure are directed to a memory device that is capable of adjusting (e.g., rapidly adjusting) the potential of a selected word line to a potential corresponding to a target level, and a method of operating the memory device.

An embodiment of the present disclosure may provide for a memory device. The memory device may include a memory block including a plurality of memory cells, and a peripheral circuit configured to apply a plurality of operating voltages to a plurality of word lines of the memory block during a program operation, wherein, during a verify operation included in the program operation, the peripheral circuit is configured to allow a selected word line, among the plurality of word lines, to float, and decrease a potential of the selected word line to a pre-level by decreasing potentials of adjacent word lines to the selected word line.

An embodiment of the present disclosure may provide for a memory device. The memory device may include a memory block including a plurality of memory cells, and a peripheral circuit configured to apply a plurality of operating voltages to a plurality of word lines of the memory block during a read operation, wherein, during the read operation, the peripheral circuit is configured to allow a selected word line, among the plurality of word lines, to float, and decrease a potential of the selected word line to a pre-level by decreasing potentials of adjacent word lines to the selected word line.

An embodiment of the present disclosure may provide for a memory device. The memory device may include a memory block including a plurality of memory cells, and a peripheral circuit configured to apply a plurality of operating voltages to a plurality of word lines of the memory block during a read operation, wherein, during the read operation, the peripheral circuit is configured to allow a selected word line, among the plurality of word lines, to float, and increase a potential of the selected word line to a first pre-level by increasing potentials of adjacent word lines to the selected word line.

An embodiment of the present disclosure may provide for a method of operating a memory device. The method may include applying a program voltage to a selected word line and applying a first pass voltage to adjacent word lines to the selected word line, decreasing a potential of the selected word line to a first level, allowing the selected word line to float, and decreasing, while the selected word line is floating, potentials of the adjacent word lines by applying a second pass voltage that is lower than the first pass voltage by a set voltage to the adjacent word lines, wherein a potential of the floating selected word line is set to a pre-level lower than the first level based on coupling with the adjacent word lines.

An embodiment of the present disclosure may provide for a method of operating a memory device. The method may include applying a first pass voltage to a plurality of word lines, decreasing a potential of a selected word line, among the plurality of word lines, to a first level, allowing the selected word line to float, and decreasing, while the selected word line is floating, potentials of adjacent word lines to the selected word line, among the plurality of word lines, by applying a second pass voltage that is lower than the first pass voltage by a set voltage to the adjacent word lines, wherein a potential of the floating selected word line is set to a pre-level lower than the first level based on coupling with the adjacent word lines.

An embodiment of the present disclosure may provide for a method of operating a memory device. The method may include applying a first read voltage to a selected word line and applying a first pass voltage to adjacent word lines to the selected word line, allowing the selected word line to float, and increasing a potential of the floating selected word line to a first pre-level higher than the first read voltage by applying a second pass voltage higher than the first pass voltage to the adjacent word lines, and applying a second read voltage higher than the first read voltage to the selected word line.

An embodiment of the present disclosure may provide for an apparatus. The apparatus may include a storage area configured to store instructions, and at least one processor configured to execute the instructions to control a verify operation included in a program operation, wherein the at least one processor is configured to control the verify operation to allow a selected word line among a plurality of word lines, to float and decrease, while the selected word line is floating, potentials of adjacent word lines to the selected word line to decrease a potential of the selected word line to a pre-level based on coupling with the adjacent word lines.

An embodiment of the present disclosure may provide for an apparatus. The apparatus may include a storage area configured to store instructions, and at least one processor configured to execute the instructions to control a read operation, wherein the at least one processor is configured to control the read operation to allow a selected word line among a plurality of word lines, to float, and decrease, while the selected word line is floating, potentials of adjacent word lines to the selected word line to decrease a potential of the selected word line to a pre-level based on coupling with the adjacent word lines.

DETAILED DESCRIPTION

Specific structural or functional descriptions in the embodiments of the present disclosure introduced in this specification or application are exemplified to describe embodiments according to the concept of the present disclosure. The embodiments according to the concept of the present disclosure may be practiced in various forms, and should not be construed as being limited to the embodiments described in the specification or application.

Various embodiments of the present disclosure will now be described more fully hereinafter with reference to the accompanying drawings, in which preferred embodiments of the present disclosure are shown, so that those skilled in the art can practice the technical spirit of the present disclosure.

Figure 1:
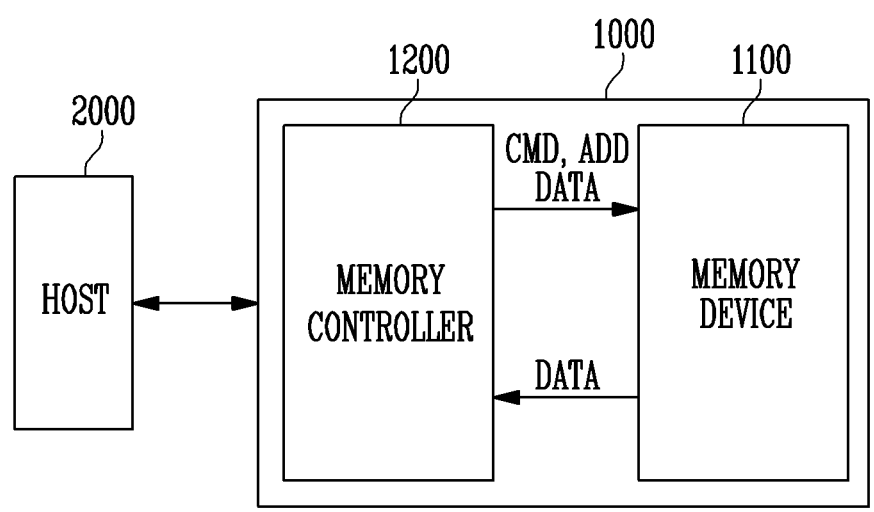
FIG. 1 is a diagram illustrating a memory system according to an embodiment of the present disclosure.

FIG. 1 is a diagram illustrating a memory system according to an embodiment of the present disclosure.

Referring to FIG. 1, a memory system 1000 may include a memory device 1100 which stores data, and a memory controller 1200 which controls the memory device 1100 under the control of a host 2000.

The host 2000 is capable of communicating with the memory system 1000 using an interface protocol, such as, for example, Peripheral Component Interconnect-Express (PCI-E), Advanced Technology Attachment (ATA), Serial ATA (SATA), Parallel ATA (PATA) or Serial Attached SCSI (SAS). In addition, the interface protocol between the host 2000 and the memory system 1000 is not limited to the above-described examples, and may be one of various interface protocols, such as, for example, Universal Serial Bus (USB), Multi-Media Card (MMC), Enhanced Small Disk Interface (ESDI), and Integrated Drive Electronics (IDE).

The memory controller 1200 may control the overall operation of the memory system 1000, and may control data exchange between the host 2000 and the memory device 1100. For example, the memory controller 1200 may program or read data by controlling the memory device 1100 in response to a request received from the host 2000. During a program operation, the memory controller 1200 may transmit a command CMD corresponding to the program operation, an address ADD, and data to be programmed DATA to the memory device 1100. Further, during a read operation, the memory controller 1200 may receive data DATA read from the memory device 1100, and may temporarily store the data DATA, and may transmit the temporarily stored data DATA to the host 2000.

The memory device 1100 may perform a program operation (i.e. storage), a read operation or an erase operation under the control of the memory controller 1200.

In an embodiment, the memory device 1100 may include for example a double data rate synchronous dynamic random access memory (DDR SDRAM), low power double data rate fourth generation (LPDDR4) SDRAM, a graphics double data rate (GDDR) SDRAM, a low power DDR (LPDDR) SDRAM, a Rambus DRAM (RDRAM) or a flash memory.

Figure 2:
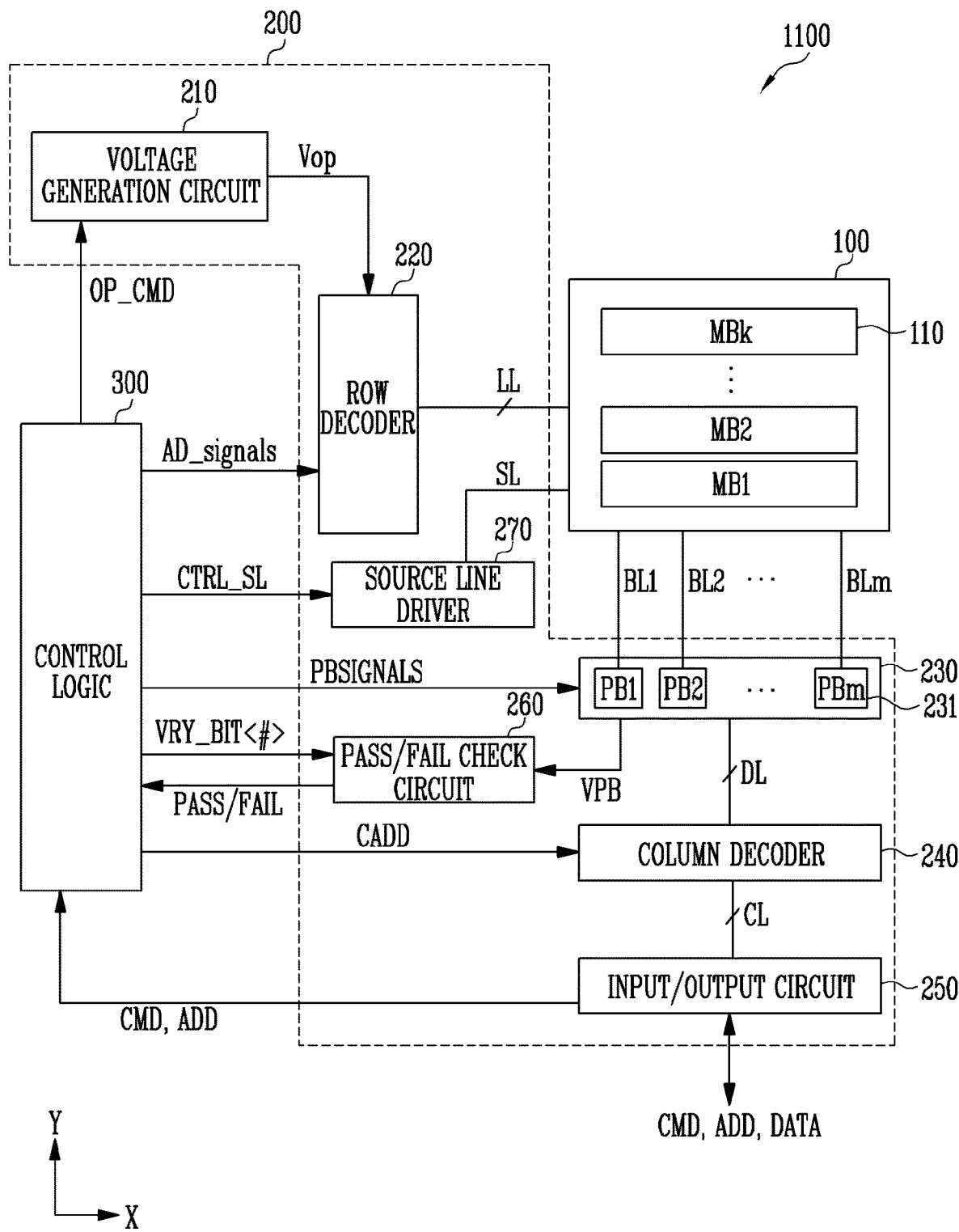
FIG. 2 is a diagram illustrating a memory device of FIG. 1.

FIG. 2 is a diagram illustrating the memory device of FIG. 1.

Referring to FIG. 2, the memory device 1100 may include a memory cell array 100 in which data is stored. The memory device 1100 may include peripheral circuits 200 configured to perform a program operation for storing data in the memory cell array 100, a read operation for outputting the stored data, and an erase operation for erasing the stored data. The memory device 1100 may include a control logic 300 which controls the peripheral circuits 200 under the control of a memory controller (e.g., under control of memory controller 1200 of FIG. 1).

The memory cell array 100 may include a plurality of memory blocks MB1 to MBk 110 (where k is a positive integer). Local lines LL and bit lines BL1 to BLm (where m is a positive integer) may be coupled to each of the memory blocks MB1 to MBk 110. For example, the local lines LL may include a first select line, a second select line, and a plurality of word lines arranged between the first and second select lines. Also, the local lines LL may include dummy lines arranged between the first select line and the word lines and between the second select line and the word lines. Here, the first select line may be a source select line, and the second select line may be a drain select line. For example, the local lines LL may include the word lines, the drain and source select lines, and source lines SL. For example, the local lines LL may further include dummy lines. For example, the local lines LL may further include pipelines. The local lines LL may be coupled to each of the memory blocks MB1 to MBk 110, and the bit lines BL1 to BLm may be coupled in common to the memory blocks MB1 to MBk 110. The memory blocks MB1 to MBk 110 may each be implemented in a two-dimensional (2D) or three-dimensional (3D) structure. For example, memory cells in the memory blocks 110 having a 2D structure may be horizontally arranged on a substrate. For example, memory cells in the memory blocks 110 having a 3D structure may be vertically stacked on the substrate.

The peripheral circuits 200 may perform program, read, and erase operations on a selected memory block 110 under the control of the control logic 300. For example, the peripheral circuits 200 may include a voltage generation circuit 210, a row decoder 220, a page buffer group 230, a column decoder 240, an input/output circuit 250, a pass/fail check circuit 260, and a source line driver 270.

The voltage generation circuit 210 may generate various operating voltages Vop that are used for program, read, and erase operations in response to an operation signal OP_CMD. Further, the voltage generation circuit 210 may selectively discharge the local lines LL in response to the operation signal OP_CMD. For example, the voltage generation circuit 210 may generate various voltages such as a program voltage, a verify voltage, a read voltage, a pass voltage, and a plurality of set voltages under the control of the control logic 300.

The row decoder 220 may transfer the operating voltages Vop to the local lines LL coupled to the selected memory block 110 in response to row decoder control signals AD_signals. For example, during a program voltage apply operation included in the program operation, in response to the row decoder control signals AD_signals, the row decoder 220 may apply the program voltage, generated by the voltage generation circuit 210, to a selected word line, among the local lines LL, in order to store charge in a selected memory cell and may apply the pass voltage, generated by the voltage generation circuit 210, to unselected word lines. The pass voltage applied allows charge in the memory cells of the unselected word line to be discharged therefrom. Further, during a verify operation (which determines whether the memory cells in a selected word line have completed programming) included in the program operation, in response to the row decoder control signals AD_signals, the row decoder 220 may sequentially apply a plurality of verify voltages, generated by the voltage generation circuit 210, to the selected word line, among the local lines LL, and may apply the pass voltage, generated by the voltage generation circuit 210, to the unselected word lines. A typical program verify operation stores a target threshold voltage in a page buffer that is coupled to each data line (e.g., bit line BL1 to BLm) and applies a ramped voltage to the control gate of the memory cell being verified. When the ramped voltage reaches the threshold voltage to which the memory cell has been programmed, the memory cell turns on and sense circuitry such as pass/fail check circuit 260 can detect a current on a bit line coupled to the memory cell. If the ramped voltage at the time of current detection is greater than or equal to a target threshold voltage, further programming is inhibited. Further, during a read operation, in response to the row decoder control signals AD_signals, the row decoder 220 may sequentially apply a plurality of read voltages, generated by the voltage generation circuit 210, to the selected word line, among the local lines LL, and may apply the pass voltage, generated by the voltage generation circuit 210, to the unselected word lines.

The page buffer group 230 may include a plurality of page buffers PB1 to PBm 231 coupled to the bit lines BL1 to BLm. The page buffers PB1 to PBm 231 may be operated in response to the page buffer control signals PBSIGNALS. For example, during a program operation, the page buffers PB1 to PBm 231 may temporarily store data to be programmed, and may adjust the potential levels of the bit lines BL1 to BLm based on the temporarily stored data to be programmed. Furthermore, during a read or program verify operation, the page buffers PB1 to PBm 231 may sense the voltages or currents of the bit lines BL1 to BLm.

The column decoder 240 may transfer data between the input/output circuit 250 and the page buffer group 230 in response to a column address CADD. For example, the column decoder 240 may exchange data with the page buffers PB1 to PBm 231 through the data lines DL or may exchange data with the input/output circuit 250 through column lines CL.

The input/output circuit 250 may transmit a command CMD and an address ADD, received from the memory controller (e.g., 1200 of FIG. 1), to the control logic 300, or may exchange data DATA with the column decoder 240.

During a read operation or a program verify operation, the pass/fail check circuit 260 may generate a reference current in response to an enable bit VRY_BIT<#>, and may compare a sensing voltage VPB, received from the page buffer group 230, with a reference voltage, generated by the reference current, and then output a pass signal PASS or a fail signal FAIL. The sensing voltage VPB may be a voltage that is controlled based on the number of memory cells determined to have passed the program verify operation.

The source line driver 270 may be coupled to memory cells included in the memory cell array 100 through the source line SL, and may control a voltage to be applied to the source line SL. The source line driver 270 may receive a source line control signal CTRL_SL from the control logic 300, and may control the voltage to be applied to the source line SL in response to the source line control signal CTRL_SL.

The control logic 300 may control the peripheral circuits 200 by outputting the operation signal OP_CMD, the row decoder control signals AD_signals, the page buffer control signals PBSIGNALS, and the enable bit VRY_BIT<#> in response to the command CMD and the address ADD.

During the verify operation included in the program operation, the control logic 300 may control the voltage generation circuit 210 and the row decoder 220 so that the potential (or otherwise considered a voltage value) of the selected word line is set to a pre-level by decreasing the potential levels of word lines adjacent to the selected word line in the state in which the selected word line is allowed to float, and thereafter the verify voltage is applied to the selected word line. As used herein, word lines adjacent to the selected word line refers not only to the closest neighbor word line on either side of the selected word line but also may include the closest next neighbor word line on either side of the selected word line and may also refer to word lines beyond the closest next neighbor word line on either side of the selected word line.

Further, during the verify operation or the read operation, the control logic 300 may control the voltage generation circuit 210 and the row decoder 220 so that a plurality of verify voltages or read voltages that are sequentially increasing are applied to the selected word line, and may also control the voltage generation circuit 210 and the row decoder 220 so that the potential of the selected word line is increased by increasing the pass voltage to be applied to unselected word lines adjacent to the selected word line in the state in which the selected word line is allowed to float.

The above-described memory device according to the embodiment of the present disclosure may adjust the potential of a selected word line to a pre-level by allowing the selected word line to float and thereafter decreasing or increasing the potentials of word lines adjacent to the selected word line, and may adjust the potential of the selected word line to a target level by applying a verify voltage or a read voltage to the selected word line, in order to decrease or increase (e.g., rapidly decrease or increase) the potential level of the selected word line during a verify operation or a read operation. According to an embodiment of the present disclosure, this operation of decreasing or increasing the potential of word line(s) adjacent to a selected word line permits the memory devices disclosed herein to operate (that is at least program, read, and/or erase) faster than prior memory devices while retaining the stable characteristics desired of being able to retain data stored therein even when the supply of power is interrupted.

Figure 3:
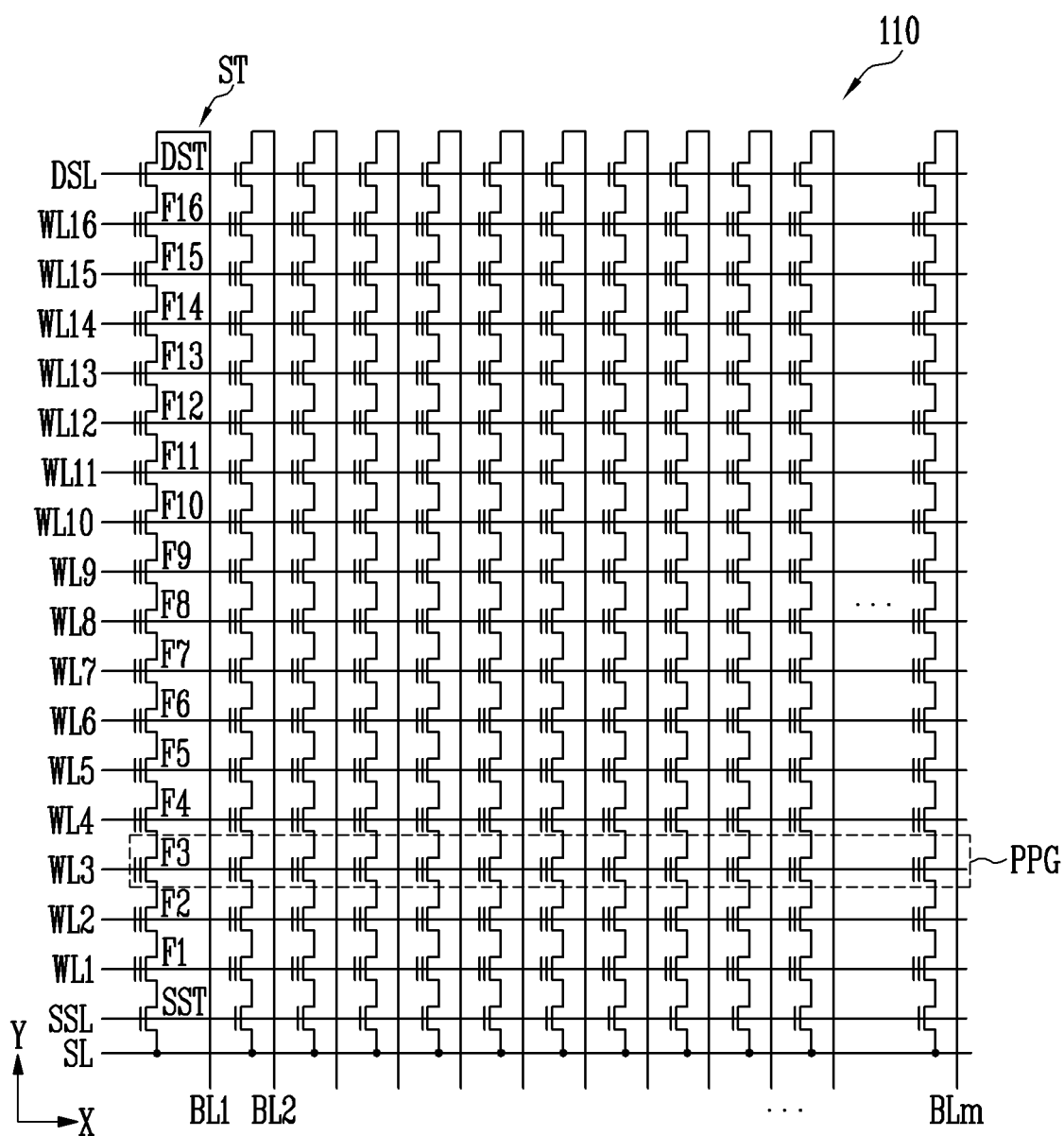
FIG. 3 is a diagram illustrating a memory block of FIG. 2.

FIG. 3 is a diagram illustrating the memory block of FIG. 2.

Referring to FIG. 3, a plurality of word lines arranged in parallel to each other between a first select line and a second select line may be coupled to the memory block 110. Here, the first select line may be a source select line SSL, and the second select line may be a drain select line DSL. In detail, the memory block 110 may include a plurality of strings ST coupled between bit lines BL1 to BLm and a source line SL. The bit lines BL1 to BLm may be coupled to the strings ST, respectively, and the source line SL may be coupled in common to the strings ST. The strings ST may be equally configured, and thus the string ST coupled to the first bit line BL1 will be described in detail by way of example.

The string ST may include a source select transistor SST, a plurality of memory cells F1 to F16, and a drain select transistor DST which are coupled in series to each other between the source line SL and the first bit line BL1. A single string ST may include at least one source select transistor SST and at least one drain select transistor DST, and more memory cells than the memory cells F1 to F16 illustrated in the drawing may be included in the string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors SST included in different strings ST may be coupled to the source select line SSL, gates of the drain select transistors DST included in different strings ST may be coupled to the drain select line DSL, and gates of the memory cells F1 to F16 may be coupled to a plurality of word lines WL1 to WL16, respectively. A group of memory cells coupled to the same word line, among the memory cells included in different strings ST, may be referred to as a "physical page (PPG)." Therefore, the memory block 110 may include a number of physical pages PPG identical to the number of word lines WL1 to WL16.

Figure 4:
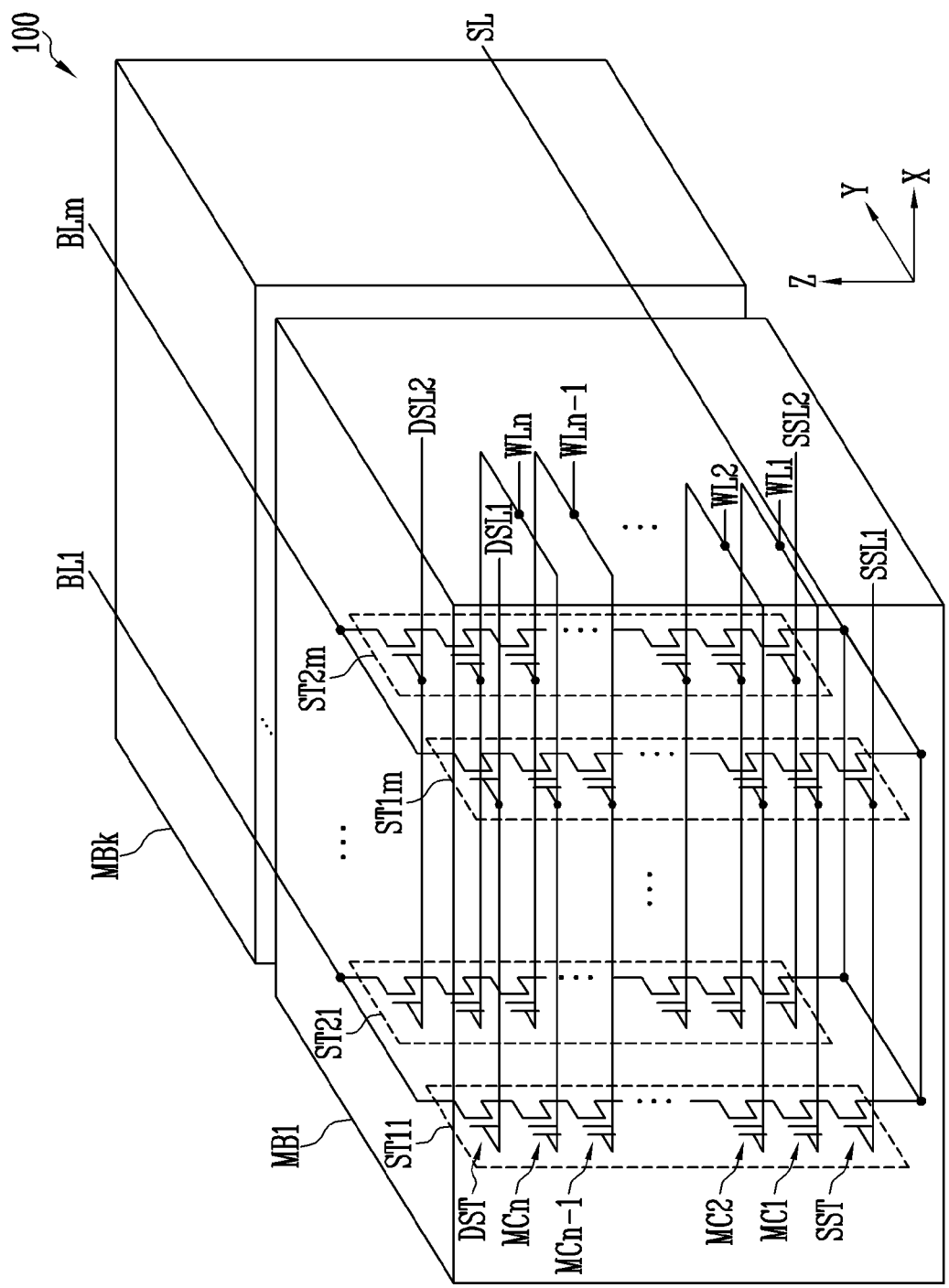
FIG. 4 is a diagram illustrating an example of a memory block having a 3D structure.

FIG. 4 is a diagram illustrating an example of a memory block having a 3D structure.

Referring to FIG. 4, the memory cell array 100 may include a plurality of memory blocks MB1 to MBk 110. Each memory block 110 may include a plurality of strings ST11 to ST1m and ST21 to ST2m (shown in FIG. 4 as a linearly extending grouping of memory cells MC1 to MCn similar to the PPGs shown in FIG. 3). In an embodiment, each of the strings ST11 to ST1m and ST21 to ST2m may be formed in an 'I' shape or a 'U' shape. In the first memory block MB1, m strings may be arranged in a row direction (e.g., X direction). Although, in FIG. 4, two strings are illustrated as being arranged in a column direction (e.g., Y direction), this embodiment is only illustrative of one embodiment, and three or more strings may be arranged in the column direction (e.g., Y direction) in other embodiments.

Each of the strings ST11 to ST1m and ST21 to ST2m may include at least one source select transistor SST, first to n-th memory cells MC1 to MCn, and at least one drain select transistor DST.

The source select transistor SST of each string may be coupled between a source line SL and the memory cells MC1 to MCn. Source select transistors of strings arranged in the same row may be coupled to the same source select line. The source select transistors of the strings ST11 to ST1m arranged in a first row may be coupled to a first source select line SSL1. The source select transistors of the strings ST21 to ST2m arranged in a second row may be coupled to a second source select line SSL2. In other embodiments, the source select transistors of the strings ST11 to ST1m and ST21 to ST2m may be coupled in common to a single source select line.

The first to n-th memory cells MC1 to MCn in each string may be coupled in series between the source select transistor SST and the drain select transistor DST. Gates of the first to n-th memory cells MC1 to MCn may be coupled to first to n-th word lines WL1 to WLn, respectively.

In an embodiment, at least one of the first to n-th memory cells MC1 to MCn may be used as a dummy memory cell. When the dummy memory cell is provided, the voltage or current of the corresponding string may be stably controlled. Accordingly, the reliability of data stored in the memory block 110 may be improved.

The drain select transistor DST of each string may be coupled between the corresponding bit line and the memory cells MC1 to MCn. The drain select transistors DST of strings arranged in the row direction may be coupled to a drain select line extending along the row direction. The drain select transistors DST of the strings ST11 to ST1m in the first row may be coupled to a first drain select line DSL1. The drain select transistors DST of the strings ST21 to ST2m in the second row may be coupled to a second drain select line DSL2.

Figure 5:
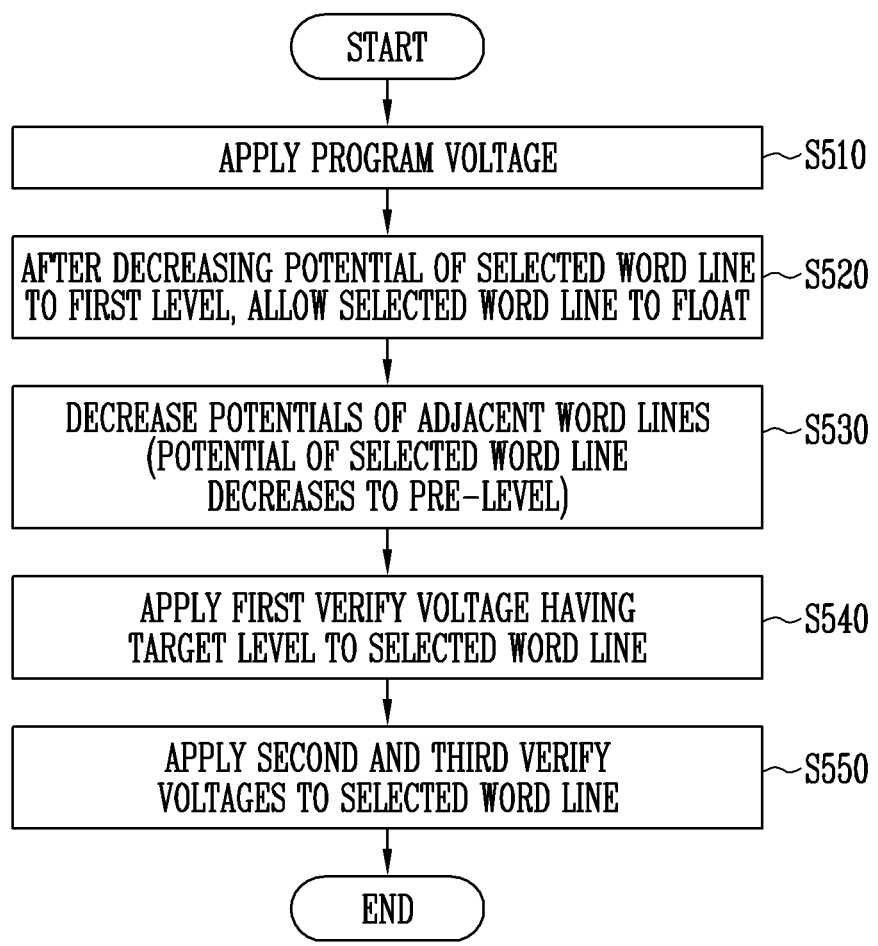
FIG. 5 is a flowchart illustrating a method of operating a memory device according to an embodiment of the present disclosure.

FIG. 5 is a flowchart illustrating a method of operating a memory device according to an embodiment of the present disclosure.

Figure 6:
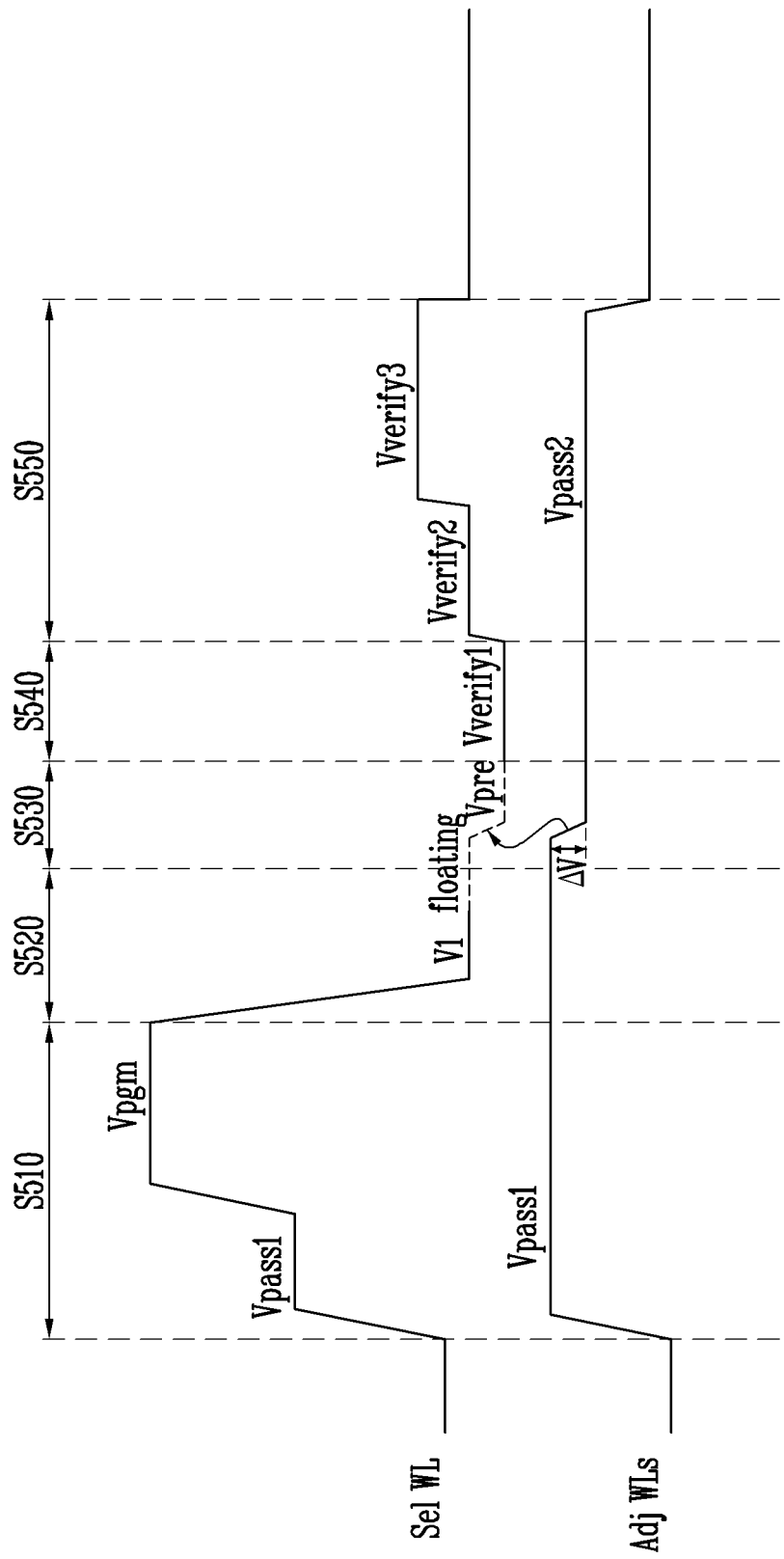
FIG. 6 is a waveform diagram of signals for explaining a method of operating a memory device according to an embodiment of the present disclosure.

FIG. 6 is a waveform diagram of signals for explaining a method of operating a memory device according to an embodiment of the present disclosure.

The method of operating a memory device according to an embodiment of the present disclosure will be described with reference to FIGS. 2 to 6.

In the embodiment of the present disclosure, a program operation of the memory device will be described below.

At step S510, a program voltage Vpgm may be applied to a selected word line Sel WL. For example, the voltage generation circuit 210 may generate and output a first pass voltage Vpass1, and the row decoder 220 may apply the first pass voltage Vpass1 to word lines WL1 to WLn of a selected memory block (e.g., MB1). Thereafter, the voltage generation circuit 210 may generate and output the program voltage Vpgm, and the row decoder 220 may apply the program voltage Vpgm to the selected word line Sel WL (e.g., WL2) of the selected memory block MB1. Here, the first pass voltage Vpass1 is applied to unselected word lines WL1 and WL3 to WLn, among the word lines WL1 to WLn.

At step S520, after the potential of the selected word line Sel WL has been decreased to a first level V1, the selected word line Sel WL is allowed to float. For example, the row decoder 220 may decrease the potential of the selected word line Sel WL to the first level V1. For example, the first level V1 may be a ground level. Thereafter, the row decoder 220 may control the selected word line Sel WL to float.

At step S530, the potential of the floating selected word line Sel WL may be decreased to a pre-level Vpre by decreasing the potentials of word lines Adj WLs adjacent to the selected word line Sel WL to the level of a second pass voltage Vpass2. The adjacent word lines Adj WLs may include a word line adjacent to the selected word line Sel WL in the direction of a source line SL and a word line adjacent to the selected word line Sel WL in the direction of bit lines BL1 to BLm. For example, the voltage generation circuit 210 may generate and output the second pass voltage Vpass2, which is lower than the first pass voltage Vpass1 by a set voltage ΔV, and the row decoder 220 may apply the second pass voltage Vpass2 to unselected word lines including the adjacent word lines Adj WLs. As the potentials of the adjacent word lines Adj WLs decrease from the potential of the first pass voltage Vpass1 to the potential of the second pass voltage Vpass2, the potential of the selected word line Sel WL may decrease to a pre-level Vpre lower than the first level V1 due to coupling with the adjacent word lines Adj WLs (for example by capacitive coupling between the selected word line Sel WL and the adjacent word lines Adj WLs).

At step S540, a first verify voltage Vverify1 having a target level may be applied to the selected word line Sel WL. For example, the first verify voltage Vverify1 may be a negative voltage (that is a lower voltage than first level V1 or the second verify voltage Vverify2). For example, the voltage generation circuit 210 may generate and output the first verify voltage Vverify1, and the row decoder 220 may apply the first verify voltage Vverify1 to the selected word line Sel WL. The potential of the selected word line Sel WL may be adjusted to the pre-level Vpre at the above-described step S530, and may then be adjusted (e.g., easily and rapidly adjusted) to the level of the first verify voltage Vverify1, which is the target level.

In the state in which the first verify voltage Vverify1 is applied to the selected word line Sel WL, the page buffer group 230 may perform a verify operation for a program state corresponding to the first verify voltage Vverify1 by sensing the potential levels or current amounts of the bit lines BL1 to BLm.

At step S550, a second verify voltage Vverify2 and a third verify voltage Vverify3 may be sequentially applied to the selected word line Sel WL. In the state in which the second verify voltage Vverify2 is applied to the selected word line Sel WL, the page buffer group 230 may perform a verify operation for a program state corresponding to the second verify voltage Vverify2 by sensing the potential levels or current amounts of the bit lines BL1 to BLm. Further, in the state in which the third verify voltage Vverify3 is applied to the selected word line Sel WL, the page buffer group 230 may perform a verify operation for a program state corresponding to the third verify voltage Vverify3 by sensing the potential levels or current amounts of the bit lines BL1 to BLm.

Figure 7:
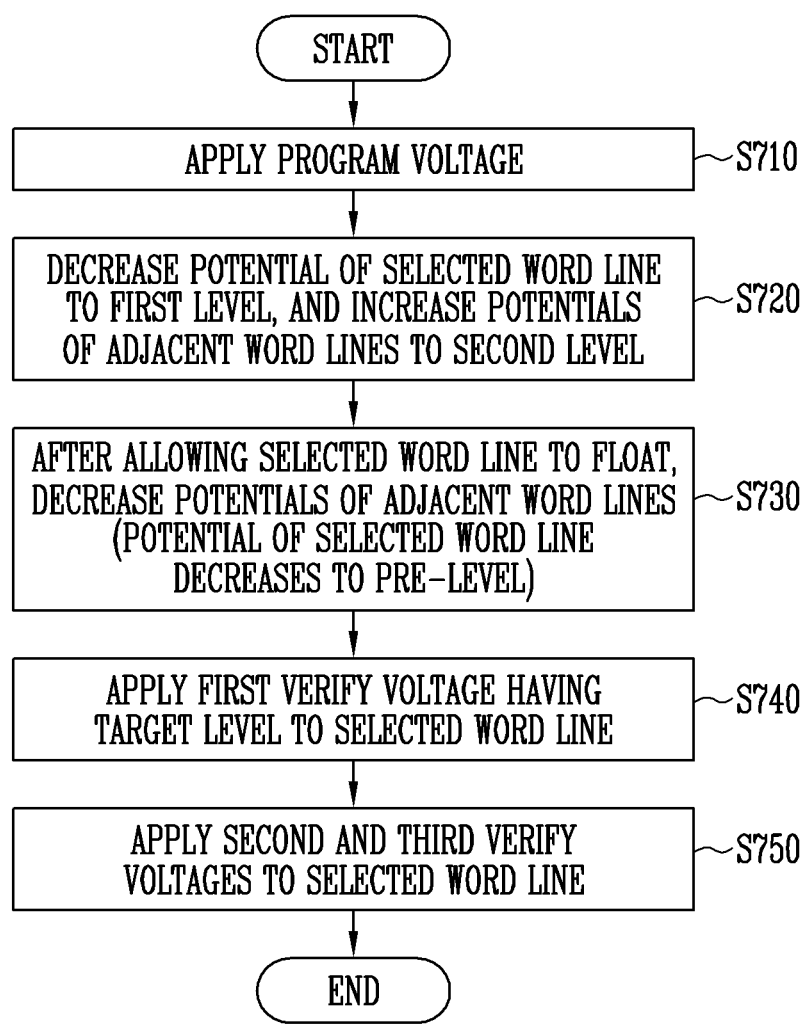
FIG. 7 is a flowchart illustrating a method of operating a memory device according to an embodiment of the present disclosure.

FIG. 7 is a flowchart illustrating a method of operating a memory device according to an embodiment of the present disclosure.

Figure 8:
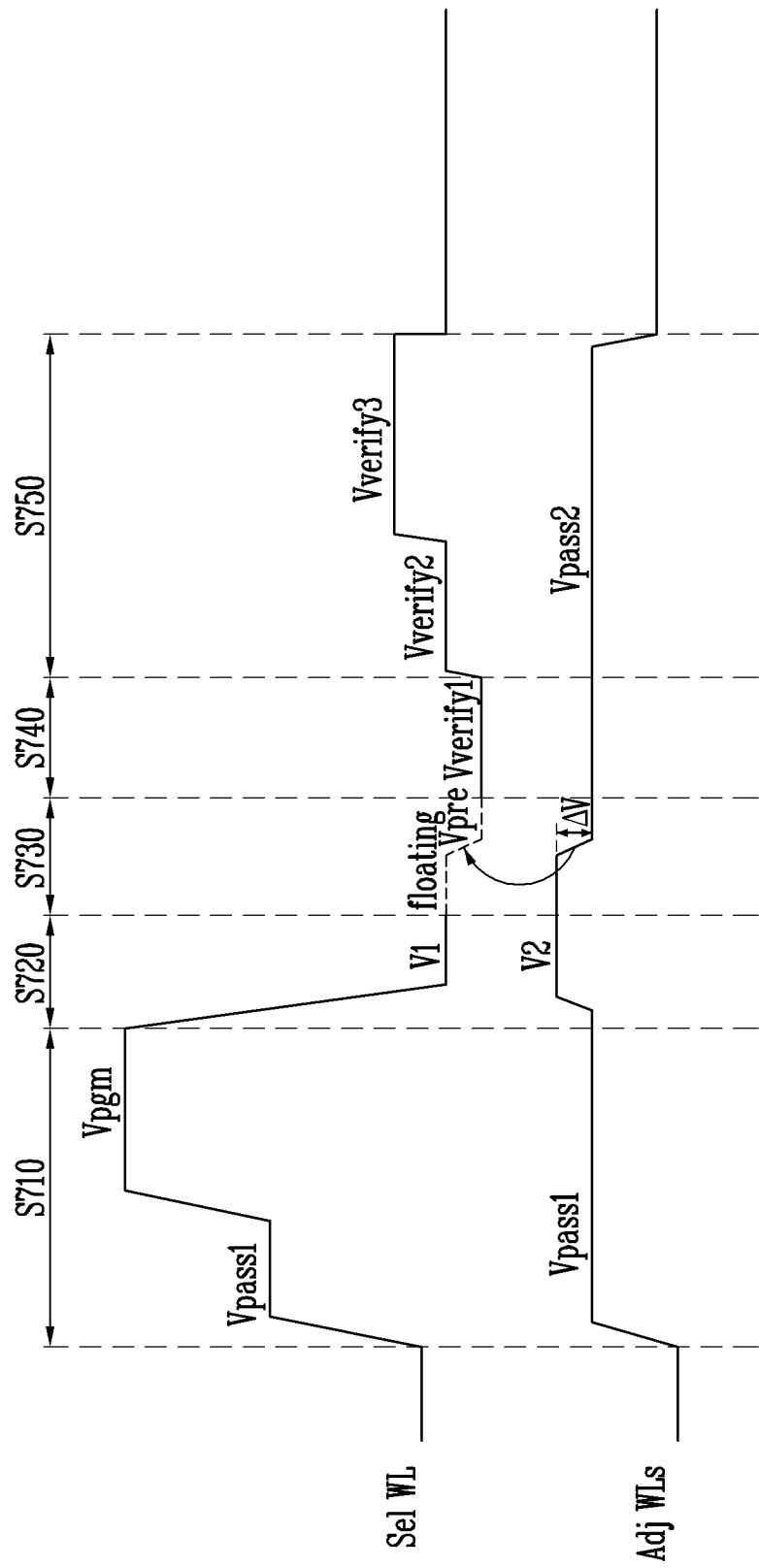
FIG. 8 is a waveform diagram of signals for explaining a method of operating a memory device according to an embodiment of the present disclosure.

FIG. 8 is a waveform diagram of signals for explaining a method of operating a memory device according to an embodiment of the present disclosure.

The method of operating the memory device according to an embodiment of the present disclosure will be described below with reference to FIGS. 2 to 4, 7, and 8.

In an embodiment of the present disclosure, a program operation of the memory device will be described below.

At step S710, a program voltage Vpgm may be applied to a selected word line Sel WL. For example, the voltage generation circuit 210 may generate and output a first pass voltage Vpass1, and the row decoder 220 may apply the first pass voltage Vpass1 to word lines WL1 to WLn of a selected memory block (e.g., MB1). Thereafter, the voltage generation circuit 210 may generate and output the program voltage Vpgm, and the row decoder 220 may apply the program voltage Vpgm to the selected word line Sel WL (e.g., WL2) of the selected memory block MB1. Here, the first pass voltage Vpass1 is applied to unselected word lines WL1 and WL3 to WLn, among the word lines WL1 to WLn.

At step S720, the potential of the selected word line Sel WL may be decreased to a first level V1, and the potentials of word lines Adj WLs adjacent to the selected word line Sel WL may be increased to a second level V2. The second level V2 is higher than the potential of the first pass voltage Vpass1. The adjacent word lines Adj WLs may include a word line adjacent to the selected word line Sel WL in the direction of a source line SL and a word line adjacent to the selected word line Sel WL in the direction of bit lines BL1 to BLm. For example, the row decoder 220 may decrease the potential of the selected word line Sel WL to the first level V1. For example, the first level V1 may be a ground level. The voltage generation circuit 210 may generate and output a voltage having the second level V2, and the row decoder 220 may apply the voltage having the second level V2 to the adjacent word lines Adj WLs. Here, the first pass voltage Vpass1 may be continuously applied to the remaining unselected word lines.

At step S730, the selected word line Sel WL may be allowed to float, and the second pass voltage Vpass2 may be applied to the adjacent word lines Adj WLs, and thus the potential of the selected word line Sel WL may decrease. Due thereto, the potential of the floating selected word line Sel WL may decrease to a pre-level Vpre lower than the first level V1.

For example, the row decoder 220 may control the selected word line Sel WL to float. Thereafter, the voltage generation circuit 210 may generate and output a second pass voltage Vpass2, which is lower than the first level V1 by a set voltage ΔV, and the row decoder 220 may apply the second pass voltage Vpass2 to unselected word lines including the adjacent word lines Adj WLs. As the potentials of the adjacent word lines Adj WLs decrease from the first level V1 to the potential of the second pass voltage Vpass2, the potential of the selected word line Sel WL may decrease to the pre-level Vpre lower than the first level V1 due to coupling with the adjacent word lines Adj WLs.

At step S740, a first verify voltage Vverify1 having a target level may be applied to the selected word line Sel WL. For example, the first verify voltage Vverify1 may be a negative voltage (that is a lower voltage than first level V1 or the second verify voltage Vverify2). For example, the voltage generation circuit 210 may generate and output the first verify voltage Vverify1, and the row decoder 220 may apply the first verify voltage Vverify1 to the selected word line Sel WL. The potential of the selected word line Sel WL may be adjusted to the pre-level Vpre at the above-described step S730, and may then be adjusted (e.g., easily and rapidly adjusted) to the level of the first verify voltage Vverify1, which is the target level.

In the state in which the first verify voltage Vverify1 is applied to the selected word line Sel WL, the page buffer group 230 may perform a verify operation for a program state corresponding to the first verify voltage Vverify1 by sensing the potential levels or current amounts of the bit lines BL1 to BLm.

At step S750, a second verify voltage Vverify2 and a third verify voltage Vverify3 may be sequentially applied to the selected word line Sel WL. In the state in which the second verify voltage Vverify2 is applied to the selected word line Sel WL, the page buffer group 230 may perform a verify operation for a program state corresponding to the second verify voltage Vverify2 by sensing the potential levels or current amounts of the bit lines BL1 to BLm. Further, in the state in which the third verify voltage Vverify3 is applied to the selected word line Sel WL, the page buffer group 230 may perform a verify operation for a program state corresponding to the third verify voltage Vverify3 by sensing the potential levels or current amounts of the bit lines BL1 to BLm.

Figure 9:
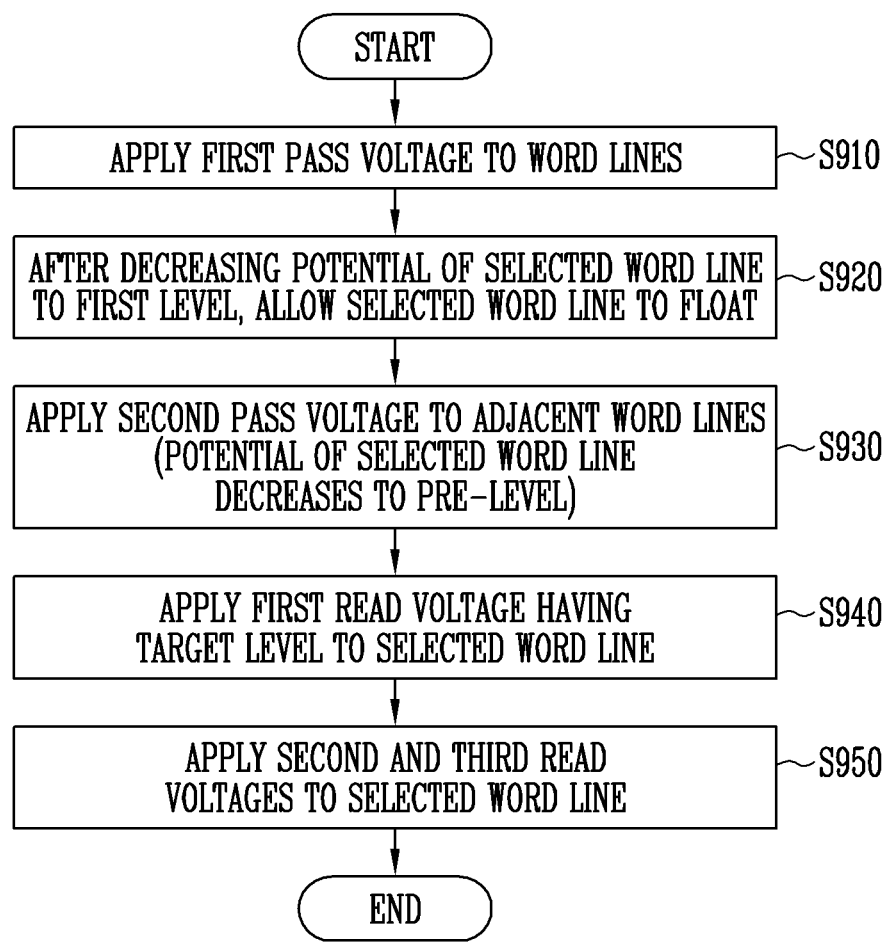
FIG. 9 is a flowchart illustrating a method of operating a memory device according to an embodiment of the present disclosure.

FIG. 9 is a flowchart illustrating a method of operating a memory device according to an embodiment of the present disclosure.

Figure 10:
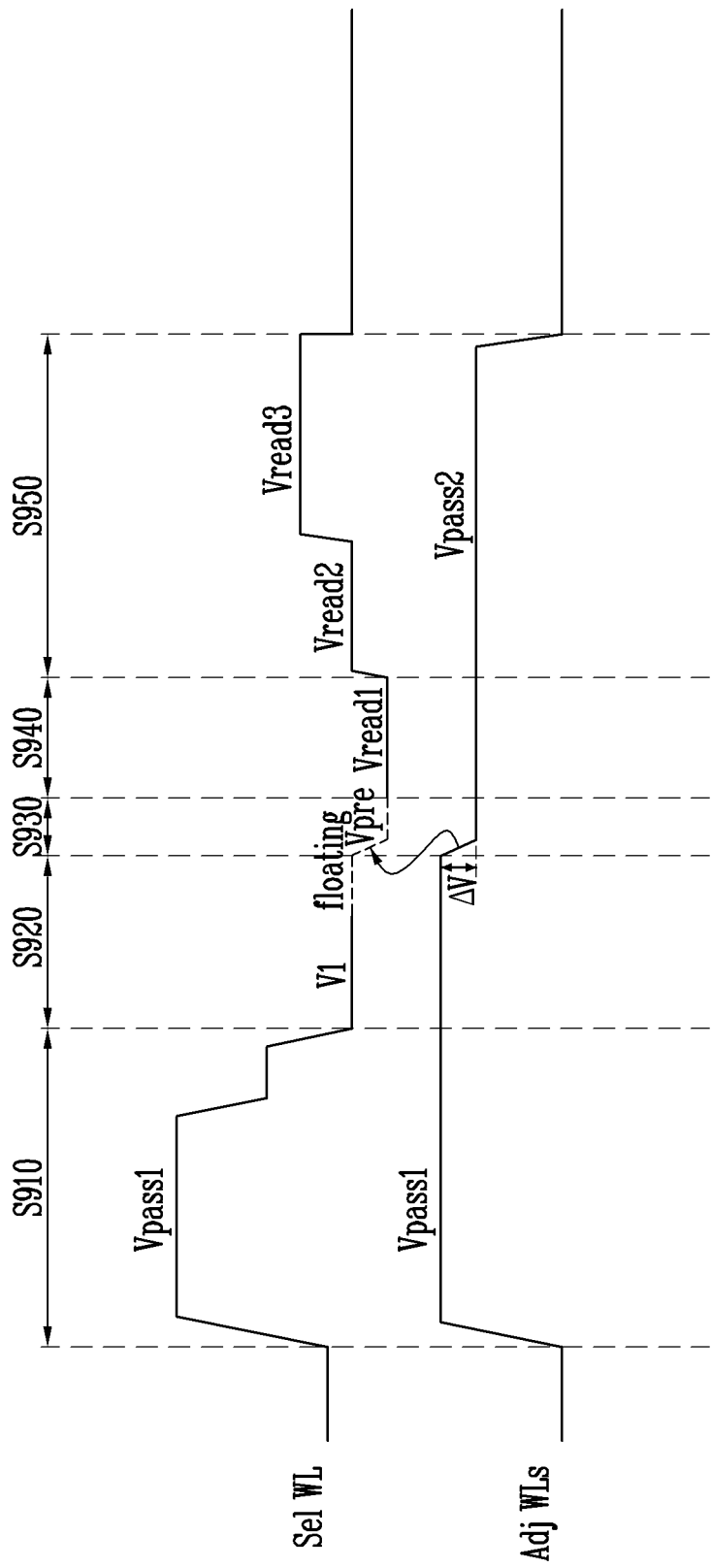
FIG. 10 is a waveform diagram of signals for explaining a method of operating a memory device according to an embodiment of the present disclosure.

FIG. 10 is a waveform diagram of signals for explaining a method of operating a memory device according to an embodiment of the present disclosure.

The method of operating the memory device according to an embodiment of the present disclosure will be described below with reference to FIGS. 2 to 4, 9, and 10.

In an embodiment of the present disclosure, a read operation of the memory device will be described below.

At step S910, a first pass voltage may be applied to a plurality of word lines WL1 to WLn of a selected memory block (e.g., MB1). For example, the voltage generation circuit 210 may generate and output a first pass voltage Vpass1, and the row decoder 220 may apply the first pass voltage Vpass1 to the word lines WL1 to WLn of the selected memory block (e.g., MB1).

At step S920, the potential of the selected word line Sel WL may be decreased to a first level V1, after which the selected word line Sel WL may be allowed to float. For example, the row decoder 220 may discharge the potential level of the selected word line Sel WL to the first level V1, which is a ground level, after which the selected word line Sel WL may be allowed to float.

At step S930, the potential of the selected word line Sel WL may be decreased by applying a second pass voltage Vpass2, which is lower than the first pass voltage Vpass1 by a set voltage ΔV, to the word lines Adj WLs adjacent to the selected word line Sel WL. Due thereto, the potential of the floating selected word line Sel WL may decrease to a pre-level Vpre lower than the first level V1. The adjacent word lines Adj WLs may include a word line adjacent to the selected word line Sel WL in the direction of a source line SL and a word line adjacent to the selected word line Sel WL in the direction of bit lines BL1 to BLm.

For example, the voltage generation circuit 210 may generate and output the second pass voltage Vpass2, which is lower than the first pass voltage Vpass1 by the set voltage ΔV, and the row decoder 220 may apply the second pass voltage Vpass2 to unselected word lines including the adjacent word lines Adj WLs. As the potentials of the adjacent word lines Adj WLs decrease from the potential of the first pass voltage Vpass1 to the potential of the second pass voltage Vpass2, the potential of the selected word line Sel WL may decrease to the pre-level Vpre lower than the first level V1 due to coupling with the adjacent word lines Adj WLs.

At step S940, a first read voltage Vread1 having the target level may be applied to the selected word line Sel WL. For example, the first read voltage Vread1 may be a negative voltage (that is a lower voltage than first level V1 or the second read voltage Vread2). For example, the voltage generation circuit 210 may generate and output the first read voltage Vread1, and the row decoder 220 may apply the first read voltage Vread1 to the selected word line Sel WL. The selected word line Sel WL may be adjusted to the pre-level Vpre at step S930, and may then be adjusted (e.g., easily and rapidly adjusted) to the level of the first read voltage Vread1, which is the target level.

In the state in which the first read voltage Vread1 is applied to the selected word line Sel WL, the page buffer group 230 may perform a data read operation corresponding to the first read voltage Vread1 by sensing the potential levels or current amounts of the bit lines BL1 to BLm.

At step S950, a second read voltage Vread2 and a third read voltage Vread3 may be sequentially applied to the selected word line Sel WL. In the state in which the second read voltage Vread2 is applied to the selected word line Sel WL, the page buffer group 230 may perform a read operation corresponding to the second read voltage Vread2 by sensing the potential levels or current amounts of the bit lines BL1 to BLm. Furthermore, in the state in which the third read voltage Vread3 is applied to the selected word line Sel WL, the page buffer group 230 may perform a read operation corresponding to the third read voltage Vread3 by sensing the potential levels or current amounts of the bit lines BL1 to BLm.

Figure 11:
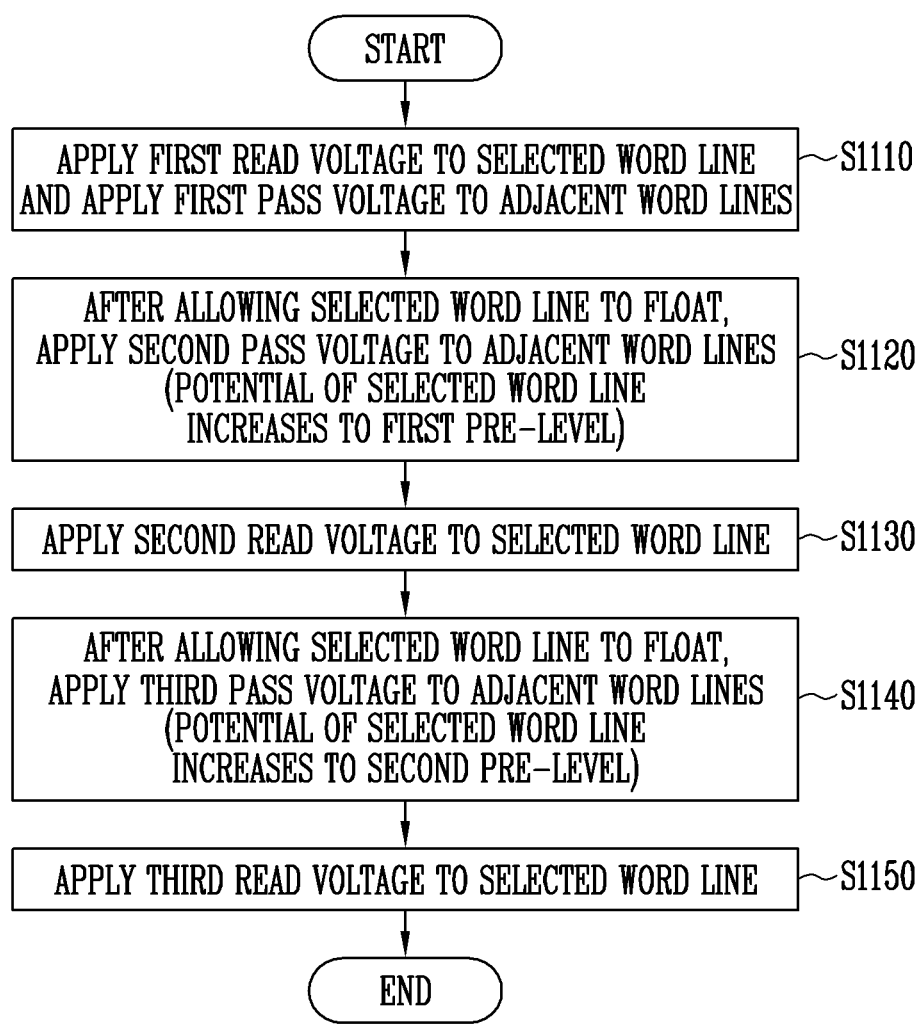
FIG. 11 is a flowchart illustrating a method of operating a memory device according to an embodiment of the present disclosure.

FIG. 11 is a flowchart illustrating a method of operating a memory device according to an embodiment of the present disclosure.

Figure 12:
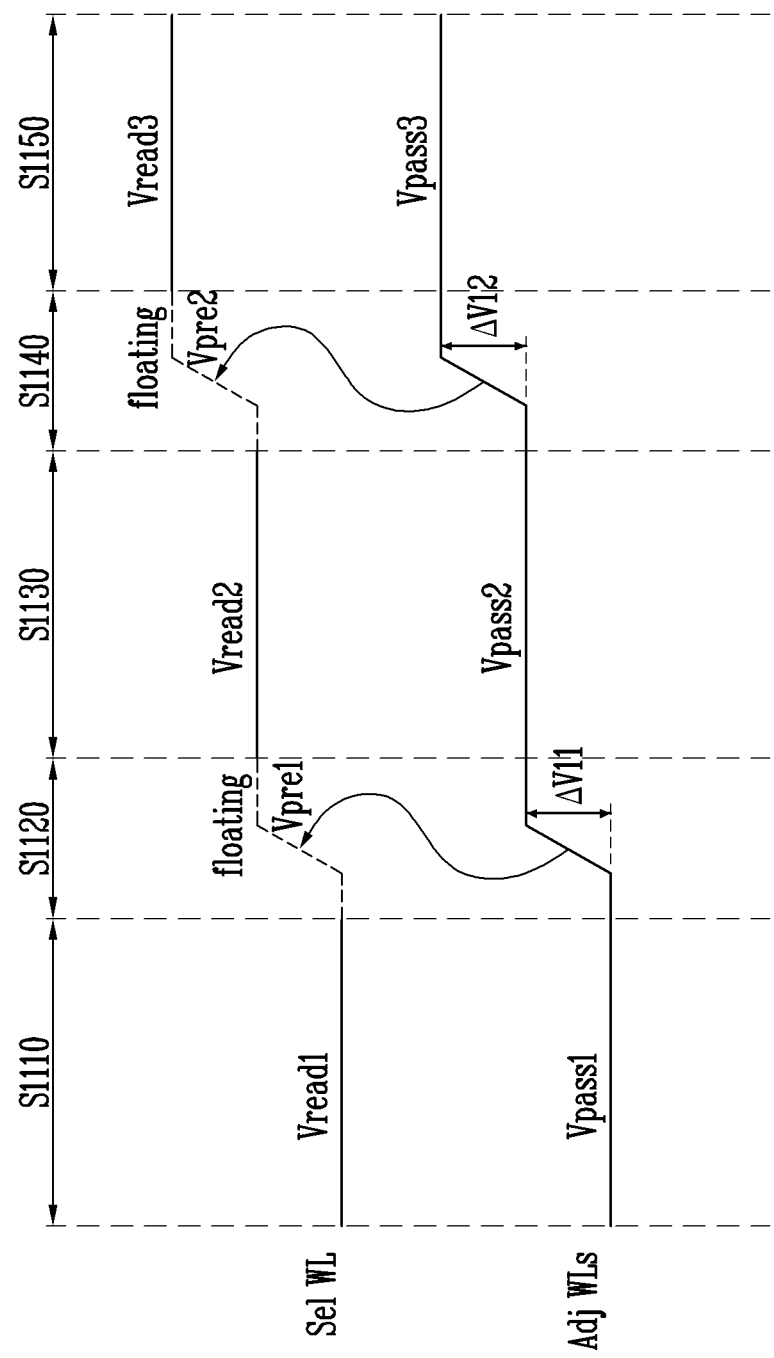
FIG. 12 is a waveform diagram of signals for explaining a method of operating a memory device according to an embodiment of the present disclosure.

FIG. 12 is a waveform diagram of signals for explaining a method of operating a memory device according to an embodiment of the present disclosure.

A method of operating a memory device according to an embodiment of the present disclosure will be described with reference to FIGS. 2 to 4, 11, and 12.

In an embodiment of the present disclosure, a read operation of the memory device will be described below.

At step S1110, a first read voltage Vread1 may be applied to a selected word line Sel WL, and a first pass voltage Vpass1 may be applied to unselected word lines WL1 to WLn including adjacent word lines Adj WLs. The adjacent word lines Adj WLs may include a word line adjacent to the selected word line Sel WL in the direction of a source line SL and a word line adjacent to the selected word line Sel WL in the direction of bit lines BL1 to BLm.

In the state in which the first read voltage Vread1 is applied to the selected word line Sel WL, the page buffer group 230 may perform a data read operation corresponding to the first read voltage Vread1 by sensing the potential levels or current amounts of the bit lines BL1 to BLm.

At step S1120, the selected word line Sel WL may be allowed to float, and thereafter a second pass voltage Vpass2, which is higher than the first pass voltage Vpass1 by a set voltage $\Delta V11$, may be applied to the adjacent word lines Adj WLs. Due thereto, the potential of the floating selected word line Sel WL increases to a first pre-level Vpre1 higher than the potential of the first read voltage Vread1.

For example, the voltage generation circuit 210 may generate and output the second pass voltage Vpass2, which is higher than the first pass voltage Vpass1 by the set voltage $\Delta V11$, and the row decoder 220 may apply the second pass voltage Vpass2 to the adjacent word lines Adj WLs. As the potentials of the adjacent word lines Adj WLs increase from the potential of the first pass voltage Vpass1 to the potential of the second pass voltage Vpass2, the potential of the selected word line Sel WL may increase to the first pre-level Vpre1 higher than the potential of the first read voltage Vread1 due to coupling with the adjacent word lines Adj WLs.

Here, the first pass voltage Vpass1 or the second pass voltage Vpass2 may be applied to the remaining unselected word lines other than the adjacent word lines Adj WLs.

At step S1130, a second read voltage Vread2 may be applied to the selected word line Sel WL. For example, the voltage generation circuit 210 may generate and output the second read voltage Vread2 higher than the first read voltage Vread1, and the row decoder 220 may apply the second read voltage Vread2 to the selected word line Sel WL. Since the potential of the selected word line Sel WL increases from the first pre-level Vpre1 higher than the potential of the first read voltage Vread1 to the potential of the second read voltage Vread2, the potential of the selected word line Sel WL may increase (e.g., rapidly increase) to the target level.

In the state in which the second read voltage Vread2 is applied to the selected word line Sel WL, the page buffer group 230 may perform a data read operation corresponding to the second read voltage Vread2 by sensing the potential levels or the current amounts of the bit lines BL1 to BLm.

At step S1140, the selected word line Sel WL may be allowed to float, and thereafter a third pass voltage Vpass3, which is higher than the second pass voltage Vpass2 by a set voltage $\Delta V12$, may be applied to the adjacent word lines Adj WLs. Due thereto, the potential of the floating selected word line Sel WL may increase to a second pre-level Vpre2 higher than the potential of the second read voltage Vread2.

For example, the voltage generation circuit 210 may generate and output the third pass voltage Vpass3, which is higher than the second pass voltage Vpass2 by the set voltage $\Delta V12$, and the row decoder 220 may apply the third pass voltage Vpass3 to the adjacent word lines Adj WLs. As the potentials of the adjacent word lines Adj WLs increase from the potential of the second pass voltage Vpass2 to the potential of the third pass voltage Vpass3, the potential of the selected word line Sel WL may increase to the second pre-level Vpre2 higher than the potential of the second read voltage Vread2 due to coupling with the adjacent word lines Adj WLs.

Here, the first pass voltage Vpass1 or the third pass voltage Vpass3 may be applied to the remaining unselected word lines other than the adjacent word lines Adj WLs.

At step S1150, a third read voltage Vread3 may be applied to the selected word line Sel WL. For example, the voltage generation circuit 210 may generate and output the third read voltage Vread3 higher than the second read voltage Vread2, and the row decoder 220 may apply the third read voltage Vread3 to the selected word line Sel WL. Since the potential of the selected word line Sel WL increases from the second pre-level Vpre2 higher than the potential of the second read voltage Vread2 to the potential of the third read voltage Vread3, the potential of the selected word line Sel WL may increase (e.g., rapidly increase) to the target level.

In the state in which the third read voltage Vread3 is applied to the selected word line Sel WL, the page buffer group 230 may perform a data read operation corresponding to the third read voltage Vread3 by sensing the potential levels or current amounts of the bit lines BL1 to BLm.

In the above-described embodiment of the present disclosure, although a description has been made such that the potentials of the adjacent word lines Adj WLs have increased by the set voltages $\Delta V11$ and $\Delta V12$ at steps S1120 and S1140, the present disclosure may increase the potentials of the adjacent word lines Adj WLs by different voltages at steps S1120 and S1140.

In the above-described embodiment of the present disclosure, although the read operation has been described by way of example, it may be applied in the same manner to a verify operation included in the program operation.

Figure 13:
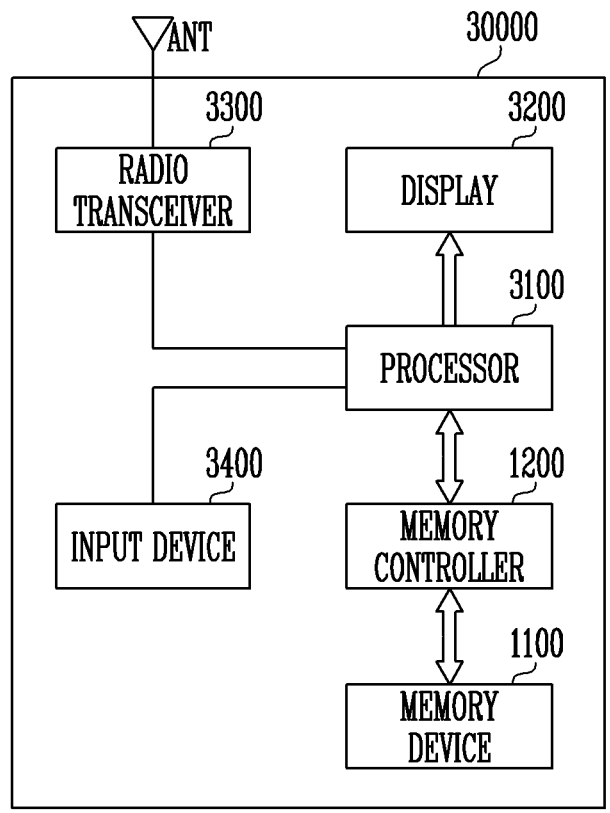
FIG. 13 is a diagram illustrating an embodiment of a memory system.

FIG. 13 is a diagram illustrating an embodiment of a memory system.

Referring to FIG. 13, a memory system 30000 may be implemented for example as a cellular phone, a smartphone, a tablet PC, a personal digital assistant (PDA) or a wireless communication device. The memory system 30000 may include a memory device 1100 and a memory controller 1200 that is capable of controlling the operation of the memory device 1100. The memory controller 1200 may control a data access operation of the memory device 1100, for example, a program operation, an erase operation or a read operation, under the control of a processor 3100.

Data programmed to the memory device 1100 may be output via a display 3200 under the control of the memory controller 1200.

A radio transceiver 3300 may exchange radio signals through an antenna ANT. For example, the radio transceiver 3300 may convert radio signals received through the antenna ANT into signals that may be processed by the processor 3100. Therefore, the processor 3100 may process the signals output from the radio transceiver 3300, and may transmit the processed signals to the memory controller 1200 or the display 3200. The memory controller 1200 may program the signals processed by the processor 3100 to the memory device 1100. Further, the radio transceiver 3300 may convert signals output from the processor 3100 into radio signals, and output the radio signals to an external device through the antenna ANT. An input device 3400 may be used to input a control signal for controlling the operation of the processor 3100 or data to be processed by the processor 3100. The input device 3400 may be implemented as a pointing device such as a touch pad or a computer mouse, a keypad or a keyboard. The processor 3100 may control the operation of the display 3200 so that data output from the memory controller 1200, data output from the radio transceiver 3300, or data output from the input device 3400 is output via the display 3200.

In an embodiment, the memory controller 1200 capable of controlling the operation of the memory device 1100 may be implemented as a part of the processor 3100 or as a chip provided separately from the processor 3100. Further, the memory controller 1200 may be implemented through the example of the memory controller 1200 illustrated in FIG. 1, and the memory device 1100 may be implemented through the example of the memory device 1100 illustrated in FIG. 2.

Figure 14:
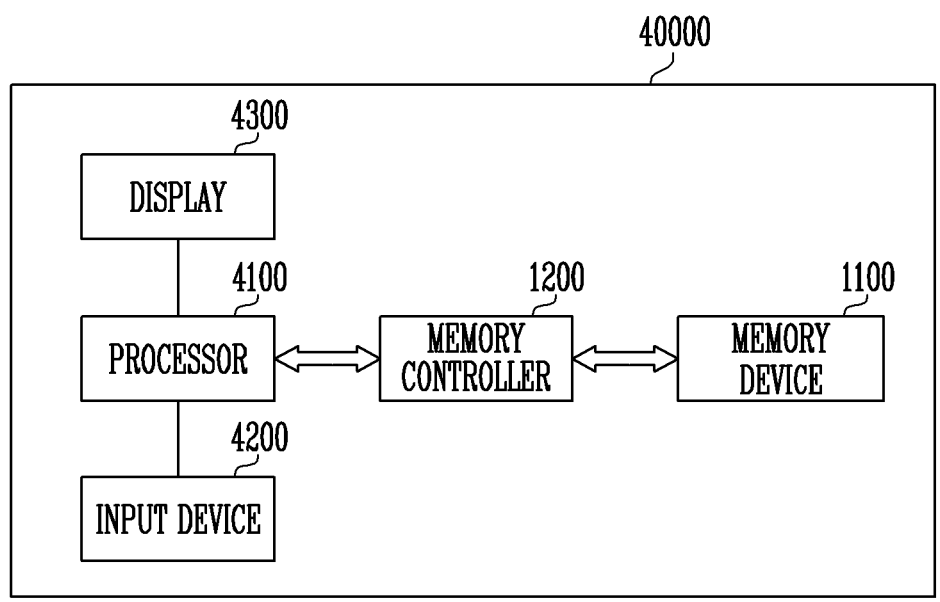
FIG. 14 is a diagram illustrating an embodiment of a memory system.

FIG. 14 is a diagram illustrating an embodiment of a memory system.

Referring to FIG. 14, a memory system 40000 may be embodied for example in a personal computer, a tablet PC, a net-book, an e-reader, a personal digital assistant (PDA), a portable multimedia player (PMP), an MP3 player, or an MP4 player.

The memory system 40000 may include a memory device 1100 and a memory controller 1200 that is capable of controlling a data processing operation of the memory device 1100.

A processor 4100 may output data, stored in the memory device 1100, via a display 4300 according to data input through an input device 4200. For example, the input device 4200 may be implemented as a pointing device such as a touch pad or a computer mouse, a keypad or a keyboard.

The processor 4100 may control the overall operation of the memory system 40000, and may control the operation of the memory controller 1200. In an embodiment, the memory controller 1200 capable of controlling the operation of the memory device 1100 may be implemented as a part of the processor 4100 or as a chip provided separately from the processor 4100. Further, the memory controller 1200 may be implemented through the example of the memory controller 1200 illustrated in FIG. 1, and the memory device 1100 may be implemented through the example of the memory device 1100 illustrated in FIG. 2.

Figure 15:
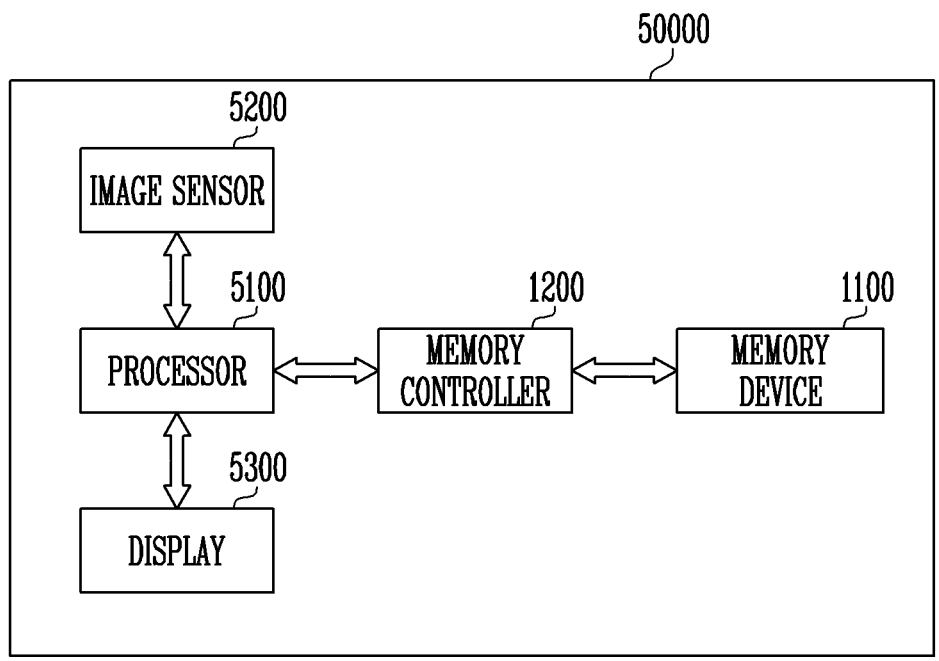
FIG. 15 is a diagram illustrating an embodiment of a memory system.

FIG. 15 is a diagram illustrating an embodiment of a memory system.

Referring to FIG. 15, a memory system 50000 may be implemented as an image processing device, e.g., a digital camera, a mobile phone provided with a digital camera, a smartphone provided with a digital camera, or a tablet PC provided with a digital camera.

The memory system 50000 may include a memory device 1100 and a memory controller 1200 that is capable of controlling a data processing operation for the memory device 1100, for example, a program operation, an erase operation or a read operation.

An image sensor 5200 of the memory system 50000 may convert an optical image into digital signals, and the converted digital signals may be transmitted to a processor 5100 or the memory controller 1200. Under the control of the processor 5100, the converted digital signals may be output via a display 5300 or may be stored in the memory device 1100 through the memory controller 1200. Further, data stored in the memory device 1100 may be output via the display 5300 under the control of the processor 5100 or the memory controller 1200.

In an embodiment, the memory controller 1200 capable of controlling the operation of the memory device 1100 may be implemented as a part of the processor 5100 or as a chip provided separately from the processor 5100. Further, the memory controller 1200 may be implemented through the example of the memory controller 1200 illustrated in FIG. 1, and the memory device 1100 may be implemented through the example of the memory device 1100 illustrated in FIG. 2.

Figure 16:
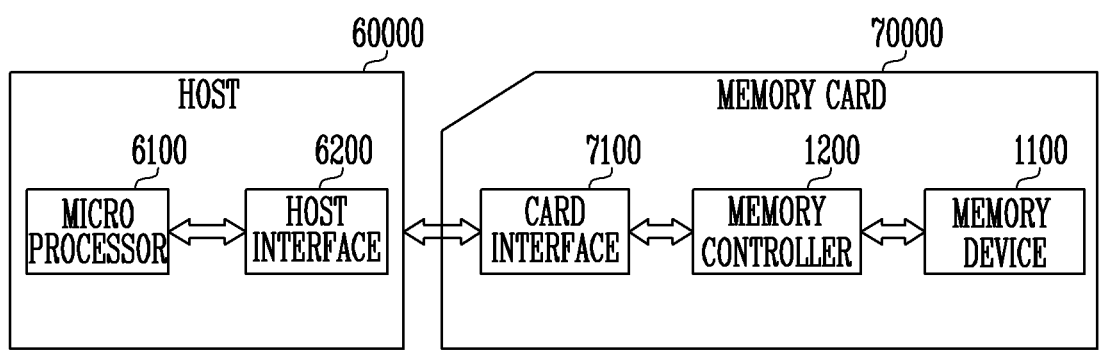
FIG. 16 is a diagram illustrating an embodiment of a memory system.

FIG. 16 is a diagram illustrating an embodiment of a memory system.

Referring to FIG. 16, a memory system 70000 may be implemented as a memory card or a smart card. The memory system 70000 may include a memory device 1100, a memory controller 1200, and a card interface 7100.

The memory controller 1200 may control data exchange between the memory device 1100 and the card interface 7100. In an embodiment, the card interface 7100 may be, but is not limited to, a secure digital (SD) card interface or a multi-media card (MMC) interface. Further, the memory controller 1200 may be implemented through the example of the memory controller 1200 illustrated in FIG. 1, and the memory device 1100 may be implemented through the example of the memory device 1100 illustrated in FIG. 2.

Further, the card interface 7100 may interface data exchange between a host 60000 and the memory controller 1200 according to a protocol of the host 60000. In an embodiment, the card interface 7100 may support a universal serial bus (USB) protocol and an interchip (IC)-USB protocol. Here, the card interface 7100 may refer to hardware capable of supporting a protocol which is used by the host 60000, software installed in the hardware, or a signal transmission method performed by the hardware.

When the memory system 70000 is coupled to a host interface 6200 of the host 60000 such as a PC, a tablet PC, a digital camera, a digital audio player, a mobile phone, console video game hardware, or a digital set-top box, the host interface 6200 may perform data communication with the memory device 1100 through the card interface 7100 and the memory controller 1200 under the control of a microprocessor 6100.

The present disclosure may adjust the potential of a selected word line using a coupling phenomenon between the selected word line and word lines adjacent thereto and thereafter adjust the potential of the selected word line to a target potential, thus adjusting (e.g., rapidly adjusting) the potential of the selected word line to a potential corresponding to a target level.

In the above-discussed embodiments, all steps may be selectively performed or skipped. In addition, the steps in each embodiment may not always be sequentially performed, and may be randomly performed. Furthermore, the embodiments disclosed in the present specification and the drawings aims to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

The methods, processes, and/or operations described herein may be performed by code or instructions to be executed by a computer, processor, controller, or other signal processing device such as memory controller 1200 (described above). The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing methods herein.

When implemented in at least partially in software, the controllers, processors, devices, modules, units, multiplexers, generators, logic, interfaces, decoders, drivers, generators and other signal generating and signal processing features such as memory controller 1200 (described above) may include, for example, a memory or other storage device for storing code or instructions to be executed, for example, by a computer, processor, microprocessor, controller, or other signal processing device.

What is claimed is:

1. A memory device, comprising:
a memory block including a plurality of memory cells; and
a peripheral circuit configured to apply a plurality of operating voltages to a plurality of word lines of the memory block during a program operation,
wherein, during a verify operation included in the program operation, the peripheral circuit is configured to allow a selected word line, among the plurality of word lines, to float, and decrease a potential of the selected word line to a pre-level by decreasing potentials of adjacent word lines to the selected word line.

2. The memory device according to claim 1, wherein, during the verify operation, the peripheral circuit is configured to:
decrease the potential of the selected word line to a first level; allow the selected word line to float; and
decrease, while the selected word line is floating, the potentials of the adjacent word lines from a level of a first pass voltage to a level of a second pass voltage that is lower than the level of the first pass voltage by a set voltage.

3. The memory device according to claim 1, wherein, during the verify operation, the peripheral circuit is configured to:
decrease the potential of the selected word line to a first level and control the potentials of the adjacent word lines to a second level;
allow the selected word line to float; and
decrease, while the selected word line is floating, the potentials of the adjacent word lines from the second level to a level of a pass voltage that is lower than the second level by a set voltage.

4. The memory device according to claim 1, wherein a potential of the floating selected word line decreases to the pre-level based on coupling with the adjacent word lines.

5. The memory device according to claim 1, wherein the peripheral circuit is configured to, after the potential of the selected word line has decreased to the pre-level, sequentially apply one or more verify voltages to the selected word line.

6. The memory device according to claim 5, wherein, among the one or more verify voltages, a first verify voltage is a negative voltage.

7. A memory device, comprising:
a memory block including a plurality of memory cells; and
a peripheral circuit configured to apply a plurality of operating voltages to a plurality of word lines of the memory block during a read operation,
wherein, during the read operation, the peripheral circuit is configured to allow a selected word line, among the plurality of word lines, to float, and decrease a potential of the selected word line to a pre-level by decreasing potentials of adjacent word lines to the selected word line.

8. The memory device according to claim 7, wherein, during the read operation, the peripheral circuit is configured to:
decrease the potential of the selected word line to a first level;
allow the selected word line to float; and
decrease, while the selected word line is floating, the potentials of the adjacent word lines from a level of a first pass voltage to a level of a second pass voltage lower than the first pass voltage by a set voltage.

9. The memory device according to claim 7, wherein a potential of the floating selected word line decreases to the pre-level based on coupling with the adjacent word lines.

10. The memory device according to claim 7, wherein the peripheral circuit is configured to, after the potential of the selected word line has decreased to the pre-level, sequentially apply one or more read voltages to the selected word line.

11. The memory device according to claim 10, wherein, among the one or more read voltages, a first read voltage is a negative voltage.

12. A memory device, comprising:
a memory block including a plurality of memory cells; and
a peripheral circuit configured to apply a plurality of operating voltages to a plurality of word lines of the memory block during a read operation,
wherein, during the read operation, the peripheral circuit is configured to allow a selected word line, among the plurality of word lines, to float, and increase a potential of the selected word line to a first pre-level by increasing potentials of adjacent word lines to the selected word line.

13. The memory device according to claim 12, wherein the peripheral circuit is configured to:
perform a first read operation by applying a first read voltage to the selected word line having the first pre-level; and
after the first read operation, allow the selected word line to float and increase the potential of the selected word line to a second pre-level higher than the first read voltage by increasing potentials of the adjacent word lines.

14. A method of operating a memory device, comprising:
applying a program voltage to a selected word line and applying a first pass voltage to adjacent word lines to the selected word line;
decreasing a potential of the selected word line to a first level;
allowing the selected word line to float; and
decreasing, while the selected word line is floating, potentials of the adjacent word lines by applying a second pass voltage that is lower than the first pass voltage by a set voltage to the adjacent word lines,
wherein a potential of the floating selected word line is set to a pre-level lower than the first level based on coupling with the adjacent word lines.

15. The method according to claim 14, further comprising:
sequentially applying one or more verify voltages to the selected word line.

16. The method according to claim 15, wherein, among the one or more verify voltages, a first verify voltage is a negative voltage.

17. A method of operating a memory device, comprising:
applying a first pass voltage to a plurality of word lines;
decreasing a potential of a selected word line, among the plurality of word lines, to a first level;
allowing the selected word line to float; and
decreasing, while the selected word line is floating, potentials of adjacent word lines to the selected word line, among the plurality of word lines, by applying a second pass voltage that is lower than the first pass voltage by a set voltage to the adjacent word lines,
wherein a potential of the floating selected word line is set to a pre-level lower than the first level based on coupling with the adjacent word lines.

18. The method according to claim 17, further comprising:
sequentially applying one or more read voltages to the selected word line.

19. The method according to claim 18, wherein, among the one or more read voltages, a first read voltage is a negative voltage.

20. A method of operating a memory device, comprising:
applying a first read voltage to a selected word line and applying a first pass voltage to adjacent word lines to the selected word line;
allowing the selected word line to float, and increasing a potential of the floating selected word line to a first pre-level higher than the first read voltage by applying a second pass voltage higher than the first pass voltage to the adjacent word lines; and
applying a second read voltage higher than the first read voltage to the selected word line.

21. The method according to claim 20, further comprising:
allowing the selected word line to float, and increasing a potential of the floating selected word line to a second pre-level higher than the second read voltage by applying a third pass voltage higher than the second pass voltage to the adjacent word lines; and
applying a third read voltage higher than the second read voltage to the selected word line.

* * * * *

UNITED STATES PATENT AND TRADEMARK OFFICE
CERTIFICATE OF CORRECTION

| | | |
|---|---|---|
| PATENT NO. | : 11,636,906 B2 | Page 1 of 1 |
| APPLICATION NO. | : 17/369393 | |
| DATED | : April 25, 2023 | |
| INVENTOR(S) | : Soo Yeol Chai | |

It is certified that error appears in the above-identified patent and that said Letters Patent is hereby corrected as shown below:

On the Title Page

Item (54) and in the Specification Column 1, Lines 1-2, Should Read:
MEMORY DEVICE AND METHOD OF APPLYING OPERATING VOLTAGES Signed and Sealed this
Twenty-seventh Day of June, 2023

Katherine Kelly Vidal
*Director of the United States Patent and Trademark Office*